US007987083B2

(12) United States Patent
Calvez

(10) Patent No.: US 7,987,083 B2
(45) Date of Patent: Jul. 26, 2011

(54) METHOD FOR SIMULATING A COMPLEX SYSTEM WITH CONSTRUCTION OF AT LEAST ONE MODEL INCLUDING AT LEAST ONE MODELLED ROUTER, CORRESPONDING COMPUTER SOFTWARE PACKAGE AND STORAGE MEANS

(75) Inventor: Jean-Paul Calvez, La Chapelle sur Erdre (FR)

(73) Assignee: Cofluent Design, Nantes Cedex (FR)

( * ) Notice: Subject to any disclaimer, the term of this patent is extended or adjusted under 35 U.S.C. 154(b) by 476 days.

(21) Appl. No.: 11/760,252

(22) Filed: Jun. 8, 2007

(65) Prior Publication Data
US 2008/0004851 A1    Jan. 3, 2008

(30) Foreign Application Priority Data

Jun. 8, 2006    (FR) .................................... 06 05094

(51) Int. Cl.
*G06F 17/50*    (2006.01)
(52) U.S. Cl. ................................ 703/13; 703/14; 703/20
(58) Field of Classification Search .................. 703/20, 703/13, 14
See application file for complete search history.

(56) References Cited

U.S. PATENT DOCUMENTS

| 6,044,369 | A * | 3/2000 | Black ................................. 707/4 |
| 7,209,978 | B2 * | 4/2007 | Thubert et al. ................. 709/242 |
| 7,362,709 | B1 * | 4/2008 | Hui et al. ....................... 370/237 |
| 2002/0039357 | A1 * | 4/2002 | Lipasti et al. ................. 370/338 |
| 2003/0016679 | A1 * | 1/2003 | Adams et al. ................. 370/401 |

OTHER PUBLICATIONS

Kalidindi et al. "Real Life" System Testing of Networking Equipment. [online]. 2004 [retrieved online Sep. 28, 2009]. IEEE Database.*
Yong et al. "Java Virtual Router". [online] Feb. 6, 2001. [retrieved online Sep. 24, 2009].*
Casado, Martin. McKeown, Nick. "The Virtual Network System" [online] Feb. 2005. [retrieved online Sep. 28, 2009] ACM Database.*
Casado, Martin. Watson, Greg. "Reconfigurable Networking Hadware: A classroom Tool" [online] 2005. [retrieved online Sep. 28, 2009]. IEEE Database.*
Kohler et al. "The Click Modular Router" [online] 2000. [retrieved online Sep. 24, 2009] ACM Database.*
Calvez et al., "A CoDesign Experience with MCSE Methodology", Proceedings of the Third International Workshop on Hardware/Software Codesign, 1994, Sep. 1994, pp. 140-147.*

(Continued)

*Primary Examiner* — Kamini S Shah
*Assistant Examiner* — Herng-Der Day
(74) *Attorney, Agent, or Firm* — David D. Brush; Westman, Champlin & Kelly, P.A.

(57) ABSTRACT

A method is provided for constructing at least a functional model of a complex system including a plurality of components. The method includes constructing the functional model of the complex system, including a hierarchized set of modelled functional components. Each of the functional modelled components is an instance of an object class belonging to a specific set of object classes. The specific set of object classes includes a "Functional Router" class, representing an abstract model of a dummy router, which describes a set of interconnections between at least two modelled functional components, each instance of the "Functional Router" class being called a modelled functional router. The functional model of the system includes at least one functional modelled router.

10 Claims, 7 Drawing Sheets

OTHER PUBLICATIONS

Sethuraman et al., "optiMap: A Tool for Automated Generation of NoC Architectures using Multi-Port Routers for FPGAs", Proceedings of Design, Automation and Test in Europe, 2006, Date '06, Mar. 2006, 6 pages.*

Majer et al., "Packet Routing in Dynamically Changing Networks on Chip," Proceedings of the 19$^{th}$ IEEE International Parallel and Distributed Processing Symposium, Apr. 2005, pp. 1-8.

Palesi et al., "APSRA: A methodology for design of Application Specific Routing Algorithms for NoC Systems," Technical Report DIIT-TR-01-060406, XP002420984, Apr. 2006, pp. 1-15.

Zachman, J.A., "A framework for Information Systems Architecture," IBM Systems Journal, IBM Corp., vol. 26, No. 3, XP009006056, 1987, pp. 276-292.

* cited by examiner

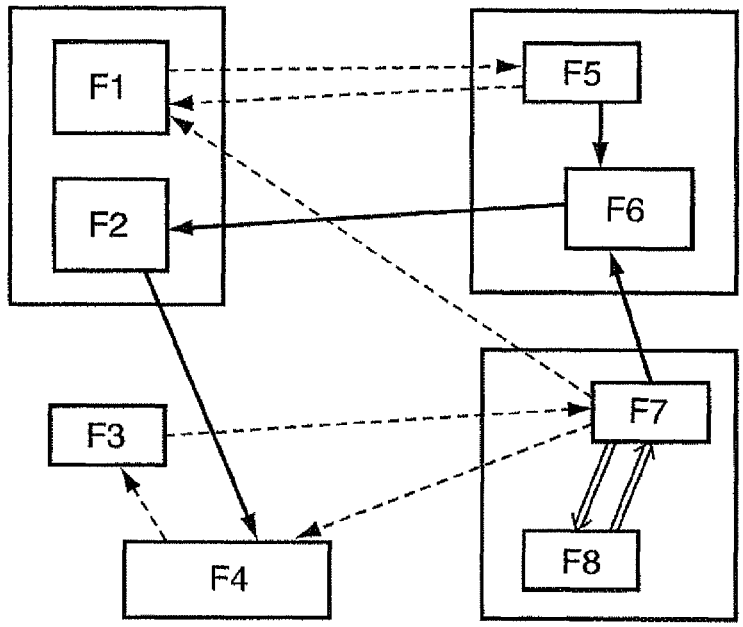
Fig. 1
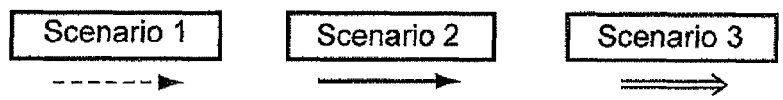
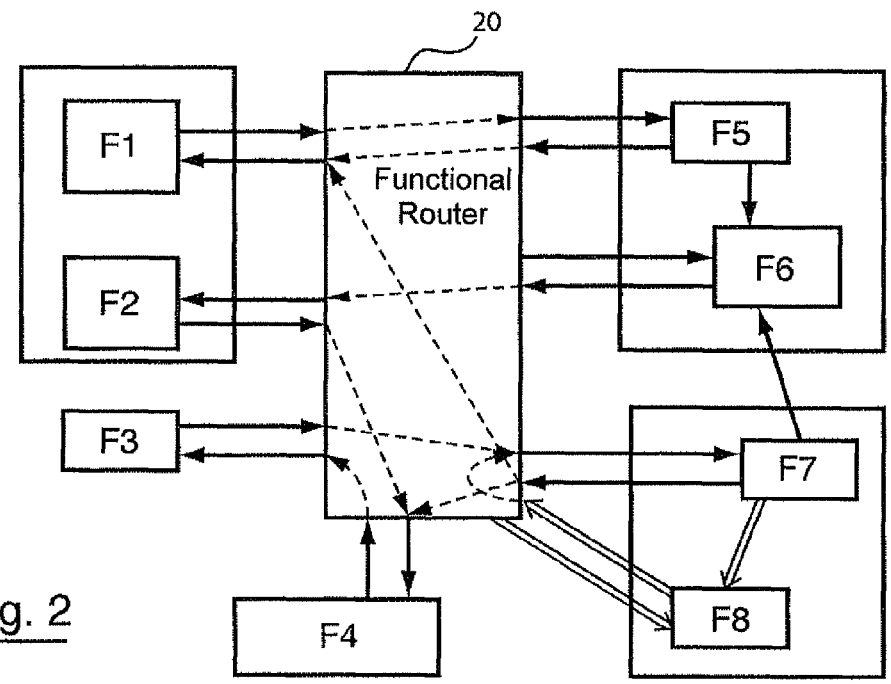
Fig. 2
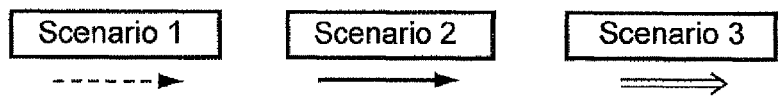

METHOD FOR SIMULATING A COMPLEX SYSTEM WITH CONSTRUCTION OF AT LEAST ONE MODEL INCLUDING AT LEAST ONE MODELLED ROUTER, CORRESPONDING COMPUTER SOFTWARE PACKAGE AND STORAGE MEANS

CROSS-REFERENCE TO RELATED APPLICATION

None.

FIELD OF THE DISCLOSURE

The field of the disclosure is that of complex systems of the type including a plurality of components, e.g., such as one or more processors executing a set of functions under the control of a hierarchized set of schedulers.

In this document, processor is understood to mean any execution resource unit. The disclosure is not limited only to the software and hardware processors used in electronic and computer systems, but also applies to mechanical processors (e.g., a robot which executes one or more tasks) or humans (e.g., an operator who executes one or more tasks).

Furthermore, in this document, a scheduler is understood to mean a function capable of establishing an order of execution of functions or tasks for a processor used as a resource. This function can be carried out in software and/or hardware form, for the hardware or software processors, or by any other technique for the other types of processors (mechanical or human).

These complex systems make it possible, in particular, but not exclusively, to operate computer programs.

More precisely, the disclosure relates to a technique for constructing a functional model of such a complex system. In other words, the technique of the disclosure relates to the design and exploration of the architectures of complex systems.

The technique of the disclosure was developed for studying the architectures of complex electronic systems, whether it involves cards or systems integrated into chips (or SoC for "System-on-Chip"). These systems systematically integrate hardware and software.

However, due to the fact that the technique of the disclosure is based on general concepts of components (such as tasks (functions), processors (and thus execution resources) and schedulers), it has a broader application than that of microprocessors. It covers any type of processor (see the above definition) having to ensure resource sharing.

The technique of the disclosure most especially claims to be suited to new telecommunications and multimedia technologies. The development of standards and their progressive stabilisation leads to the necessity of creating open-ended and thus "remote-configurable" equipment. Dynamic configuration and therefore dynamic scheduling are solutions making it possible to respond to the changing functional capabilities of products.

In electronic and computer systems, complex systems are produced by assembling hardware components: standard processors (or CPU, for "Central Processing Unit"), microprocessors (or MCU, for "Microcontroller Unit") signal processing processors (or DSP for "Digital Signal Processor"), application-specific integrated circuits (or ASIC), programmable logic arrays, in particular programmable gate arrays (or FPGA for "Field Programmable Gate Arrays"), thus forming the hardware platform of the system. Added to this platform is a set of software (generally real-time operating systems, including, in particular, a scheduler) developed for each software processor (CPU, MCU, DSP), as well as the configuration of the hardware processors (ASIC, FPGA). Once integrated (trend towards systems on silicon—"System-On-Chip"), all of these components (hardware and software) constitute a complex system for which it is nearly impossible to predict the detailed behaviour as well as certain properties, such as their performance.

The designing of complex systems is an activity upstream from production, integration and testing, which, at a very early point, requires engineers to anticipate the properties of the system being developed in order to decide all of the characteristics of the components.

With the increase in complexity and the reduction of development time, designers must have design support tools (CAD). The technology of the disclosure meets such a need.

Predicting the properties of such systems in terms of performance, in a general sense, results in the simulation of abstract models representing, at best, complex electronic systems capable of blending hardware processors (FPGA, ASIC) and software processors (CPU, MCU, DSP). The very nature of current electronic systems and those of the future, which result from the integration of real-time software being run on one or more processors themselves coupled with a complex and highly varied hardware environment, leads to the need for having fast and performing simulation techniques in order for the solutions to be verified and validated most effectively and as soon as possible during their design. For this reason, simulation technologies are very critical to the computer-assisted electronic design industry (or EDA for "Electronic Design Automation").

BACKGROUND OF THE DISCLOSURE

Today, more and more systems are multi-domain, multi-application and multi-service (or multi-function). The problem is then posed of creating models for these systems resulting from the association of a set of use cases, so as to produce scenarios representative of anticipated situations implementing several applications and services of the system.

To illustrate the problem, current and future multimedia products will be considered. They aim to respond simultaneously to multiple functionalities according to various situations or scenarios of use: communicating at the same time as filming a small video sequence, receiving electronic mail (e-mail) during an MP3 music playback, browsing an Internet site while at the same time following GPS instructions, etc.

Each functionality corresponds to a use case. Each use case is satisfied by a set of services which work together: taking a photo involves image capture, adaptation of the image to the LCD display format, JPEG compression, flash memory backup. The description of the functional model responding to a use involves the description of the couplings between the services concerned, which includes the temporal behaviour of each service and communications between services.

Real use scenarios correspond to the composition of several use cases. Certain services are then shared: LCD display, backup memory, image capture, communication protocol, etc. The problem is then posed of describing the solution for the system which is capable of carrying out a large variety of scenarios. The model to be represented involves consideration of nearly all the possible couplings between services, which results in a true "spider web" of interconnections.

Furthermore, functional modelling is not sufficient for deciding upon production solutions. The choice and exploration of possible architectures also requires consideration of the components required as resources for executing the services: processor, memory, bus, store controller, etc. Furthermore, with the development of technologies for producing integrated systems tending towards the use of silicon arrays, these systems increasingly have an effective physical means of interconnecting the execution means via a distributed structure of interconnecting components (buses, bridges, routers, etc.). The architectural model capable of enabling analyses and evaluations thus becomes nearly impossible to obtain due to the complexity of the functional interconnections that are being produced via a distributed structure of physical interconnecting components.

A new degree of complexity also appears with configurable and even dynamically reconfigurable products. For example, a mobile terminal is remotely configured by the communication network so as to satisfy a particular temporary function, such as a bank transaction, or simply its adaptation to the closest means of communication (software-defined radio).

The current technique for describing functional models or behaviors includes considering each necessary service as a "box" (or functional/logical component) ensuring a behaviour with respect to its inputs-outputs. These boxes are coupled via functional communication links of the point-to-point or multipoint type.

The simulation of these models requires description of the behaviour of each of the services and description of the scenarios considered for analyses of the solutions. Due to the many potential interconnections between services, all of them must be expressed in the behaviour of the services.

Furthermore, the creation of an architectural model blending the behaviour of the application for a variety of use cases with the distributed topologies of the current or future platforms is a laborious and very time-consuming task. Furthermore, any modification of the application or the platform requires redoing a large portion of the modelling work. These difficulties seriously impede companies from investing in such developments of models, which means that the exploration of architectures does not occur and that, as a result, the performance levels of the architectural choices are only discovered very late in the development cycle, with a very significant risk of obtaining unsatisfactory malfunctions and constraints.

The major disadvantage of the aforesaid current technique is the significant amount of time and the high level of skill required for developing such models, due to the exponential growth in the work associated with the need to clearly express all potential communications.

A second resultant disadvantage is also the monolithic nature of the model. This means that the model contains all of the features in a highly interwoven manner: functional segmentation, mixing of the behaviors for processing and communication, temporal properties which result therefrom. Any change or new configuration of use makes it necessary to reconsider a large portion of the model.

A third disadvantage relates to the near impossibility of creating a complex multi-domain (and/or multi-application) model by integrating models, each developed for its domain. The technique of re-using and integrating models considered to be IPs (Intellectual Properties) is not viable.

The above disadvantages lead to the situation wherein the designers do not explore possible architectures for such systems, due to reasons of cost and a lack of time, and therefore rely more upon their experience and even their intuition in making architecture choices. This results in difficulties during the integration phase or even later during use of the product. Furthermore, neither do companies fund knowledge and expertise per domain, due to the impossibility of ensuring multi-domain integration thereof.

SUMMARY OF THE DISCLOSURE

A method is proposed for constructing at least a functional model of a complex system including a plurality of components, said method including constructing the functional model of the complex system including a hierarchized set of modelled functional components, each of the modelled functional components being an instance of an object class belonging to a first specific set of object classes. Said first specific set of object classes includes a "Functional Router" class, representing an abstract model of a dummy router, which describes a set of interconnections between at least two modelled functional components, each instance of the "Functional Router" class being called a modelled functional router. Said functional model of the system includes at least one modelled functional router.

Thus, in this particular example, the general principle may include, for example, replacing the inventory of all the interconnections between modelled functional components included in the functional model of the system, with one or more modelled functional routers capable of ensuring these interconnections between the modelled functional components which are linked to it.

In other words, a new type of modelled functional component is used, named a modelled functional router, making it possible to route messages or transactions between modelled functional components (components) of the model. This makes it possible to facilitate the creation of functional models for complex systems.

Therefore, contrary to the prior art, it is no longer considered that each service is a box for which it is necessary to describe (by an inventory of interconnections) the behaviour of each of the services and the use scenarios for these services.

Each modelled functional router advantageously possesses an input/output pair for each of said at least two modelled functional components for which said modelled functional router describes the interconnections.

Advantageously, the number of input/output pairs that each functional router possesses can be modified dynamically.

According to one advantageous characteristic, each modelled functional router uses a routing table for routing a request received at one of its inputs, coming from a first modelled functional component, to one of its outputs, intended for a second modelled functional component, the routing being based on the content of said request.

Said routing table advantageously carries out routing belonging to the group including static routing and dynamic routing.

Said functional model of the system advantageously possesses a topology belonging to the group including:
- a topology with a single modelled functional router;
- a topology with at least two independent modelled functional routers;
- a topology with at least two hierarchized modelled functional routers.

In one advantageous example of the disclosure, said construction step makes it possible to obtain at least two simple models of the system each including at least one modelled router. Furthermore, said method includes constructing a more complex model of the system by combining said at least two simple models of the system, with the use of at least one modelled router to represent the required interconnections between said at least two simple models of the system.

Each modelled functional router is advantageously defined at least by a first attribute ("concurrency") indicating the number of simultaneous communications possible for said modelled functional router.

Each modelled functional router is advantageously defined at least by a second attribute ("routing time") indicating a transfer time due to said modelled functional router.

The method advantageously includes constructing a platform model for the complex system including a set of modelled physical components, each of the modelled physical components being an instance of an object class belonging to a second specific set of object classes. Said second specific set of object classes includes a "Physical Router" class, representing an abstract model of a physical router, actually included in the complex system, which describes a set of interconnections between at least two modelled physical components, each instance of the "Physical Router" class being called a modelled physical router. Said platform model of the complex system includes at least one modelled physical router.

In one particular example of the disclosure, the method includes distributed mapping of said functional model to said platform model, via distributed assignment of said at least one modelled functional router to said at least one modelled physical router, making it possible to obtain an architectural model of said complex system.

In a particular example, the method further includes recording the functional model on a computer-readable medium.

Said complex system is advantageously a complex electronic system, for example.

In another example, the disclosure relates to a computer software package downloadable from a communication network and/or recorded on a computer-readable medium and/or executable by a processor, characterized in that it includes programme code instructions for executing the steps of the aforesaid method, in at least one of its embodiments, when said programme is run on a computer.

In yet another example, the disclosure relates to a storage means, possibly completely or partially removable, computer-readable, storing a set of instructions executable by said computer for implementing the aforesaid method, in at least one of its embodiments.

BRIEF DESCRIPTION OF THE DRAWINGS

Other characteristics and advantages will become apparent upon reading the following description of one or more examples, given for illustrative and non-limiting purposes (all of the embodiments of the disclosure and/or claims are not limited to the characteristics and advantages of these examples), and from the appended drawings in which:

for the same complex system example, FIG. 1 shows a desired modelling and FIG. 2 a modelling introduced by a particular example of the method of the disclosure;

DETAILED DESCRIPTION OF ILLUSTRATIVE EMBODIMENTS

Figure 3:
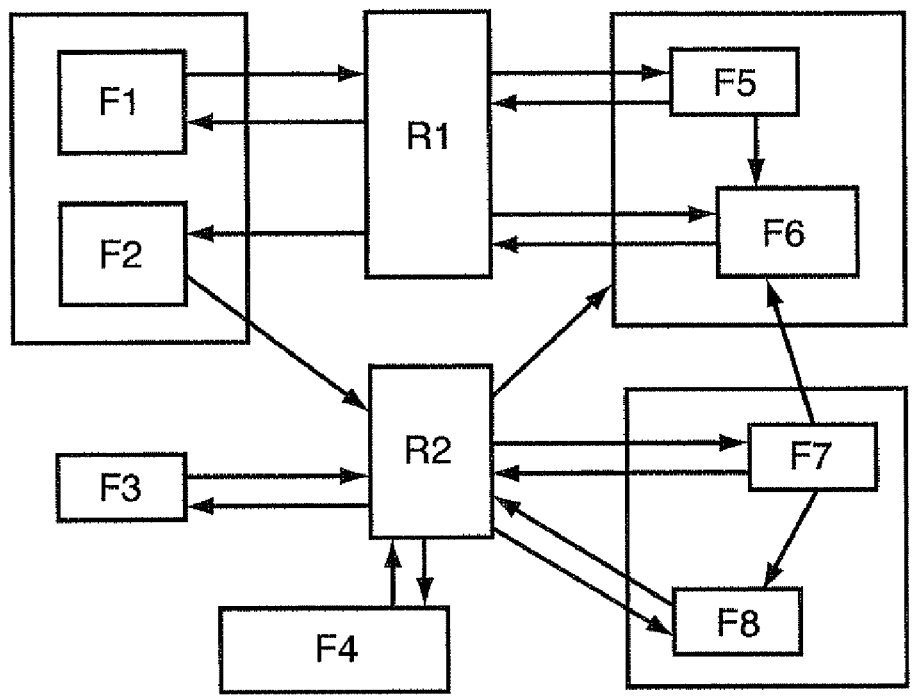
FIG. 3 shows a first example of a system model according to the disclosure, including two independent modelled routers.

In all of the figures of this document, identical elements and steps are designated by the same numeric reference.

1. General Principle

The disclosure thus relates to a method for constructing at least a functional model of a complex system including a plurality of components. Each model of the system includes a hierarchized set of modelled components. Each of the modelled components is an instance of an object class belonging to a specific set of object classes.

According to the disclosure, a new "Router" object class is proposed, representing an abstract model of any router, a dummy or actually included in the complex system, which describes a set of interconnections between at least two modelled components. Each instance of the "Router" class is called a modelled router. Each model of the system includes at least one modelled router.

This general principle is now presented by way of an example, in relation to FIGS. 1 and 2 which, for the same complex system, show a desired modelling (FIG. 1) and a modelling according to a particular example of the disclosure (FIG. 2).

As shown in FIG. 1, the desired modelling is an assemblage of services or functions (referenced F1 to F8) in significant number (generally greater than ten). Each scenario involves a subset of the functions which cooperate via exchanges of data so as to produce a functionality for the user. Overlapping of the scenarios leads to the identification of a particularly complex functional interconnection network.

Thus, in the example of FIG. 1:
a first scenario involves the modelled functions F1, F3, F4, F5 and F7, the functional interconnections between these modelled functions being shown by dotted arrows;
a second scenario involves the modelled functions F2, F4, F5, F6 and F7, the functional interconnections between these modelled functions being shown by single solid line arrows; and
a third scenario involves the modelled functions F7 and F8, the functional interconnections between these modelled functions being shown by double solid line arrows.

As shown in FIG. 2, the solution introduced by the disclosure includes replacing the inventory of all of the interconnections with one or more functional components (there is only one of them, referenced 20, in this example) capable of ensuring all of the possible interconnections between the modelled functions (or services) which are linked to it. A modelled component such as this is called a modelled router (it is also possible to replace the term router with any of the following expressions: message router, transaction router or else functional router).

The representation of the modelled router made in the graphic form of a rectangle in FIG. 2 is not limiting. Any shape is viable as a representation of this concept (a text, for example).

Each modelled service is in general linked to the modelled functional router by a maximum of two links (without this being a systematic rule): one at the input for submitting a request to it, the other at the output for obtaining a result or for generating an external request. The number of inputs and outputs of a router is completely dynamic. Thus, links can be added and removed without interfering with the behaviour of the resulting model.

The routing of each request or transaction by the modelled router 20 to its recipient is based on the use of a routing table. Each request must contain an indicator making it possible to locate its recipient. The indicator of the request is interpreted by the modelled router so as to determine the output, and this is done with the aid of the routing table. The operation of a modelled router is as follows:

standby at all of the inputs;

as soon as each input is activated, identification of the sending output from the contents of the transaction received;

sending of the transaction to the output.

Routing can be static (defined upon initialisation of the model) or dynamic (develops through changes during development of the model). The creation of the routing tables can be manual or automatic.

Figure 4:
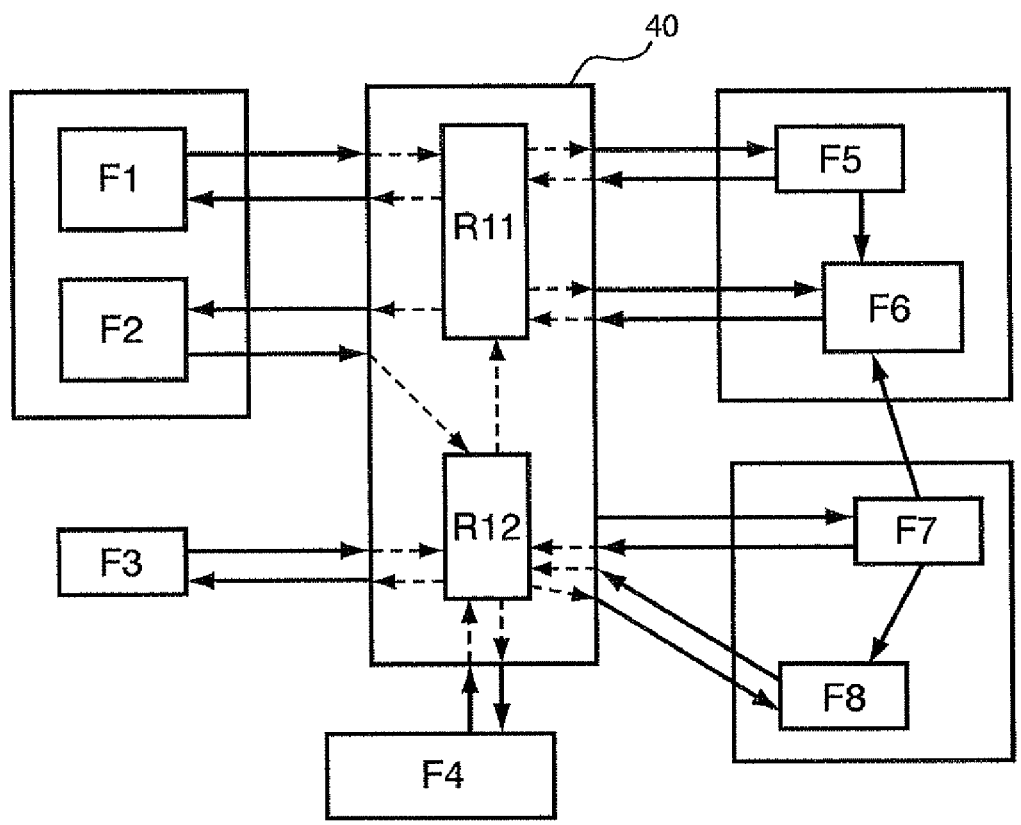
FIG. 4 shows a second example of a system model according to the disclosure, including two hierarchized modelled routers.

The solution based on a central modelled router, as shown in FIG. 2, is not mandatory. As a matter of fact, the routing technique can occur by refinement (hierarchy of modelled routers), as shown in FIG. 4, and/or by partitioning into several independent modelled routers, as shown in FIG. 3. Partitioning (FIG. 3) includes dealing with the problem in groups of services or functions, which results in identifying independent modelled routers R1, R2. A service itself may require the use of modelled router(s). The refinement of a modelled router (FIG. 4) results in the revealing, within a modelled router 40, of more basic interconnected internal modelled routers R11, R12. Refinement and partitioning promote the study of architectures because the more basic modelled routers are more easily assignable to physical interconnecting components.

The modelled router technique shown above for the description of a functional model is applicable for any type of model containing exchange links between modelled functions, modelled modules, or components (i.e., any modelled components) in the general sense. In the field of electronic systems, this technique is, of course, also viable for describing a platform model (set of modelled physical components such as processing or storing resources and interconnections between these modelled components). As a matter of fact, all of the interconnections can be described by one or more components of the modelled router type (see the above discussion).

An architectural model of a complex system (e.g., electronic) being the result of the mapping (assignment) of a functional model to a platform model, the problem is then posed of assigning the modelled functional routers so that the interconnections that they represent are modelled by the platform. A technique for distributed assignment of the modelled functional routers to the modelled physical routers and communications interfaces of the processor-type resources make it possible to obtain the resulting architectural model. This technique is described below by way of an application example.

Furthermore, in an alternative example of the method of the disclosure, more complex models are constructed, via integration or aggregation of simpler models, by using routing components to represent the required interconnections. This alternative is not limited by the topology of each starting model and that of the resulting model. One or more modelled routers can exist in each model. The result can also be reached by merging as well as by an addition of modelled routers.

2. Application Example

The modelled router technique of the disclosure applies in particular, but not exclusively, to the study of the architectures of complex electronic systems, whether it involves cards or systems integrated into a chip (SoC—System-on-Chip). These systems systematically integrate hardware and software as execution resources for services.

The study of such systems passes first through their functional and then architectural modelling. These models serve to provide checks and analyses of both functional and performance-related properties. The properties are obtained by simulation of the models. For more information, refer to the MCSE methodology (Design Method for Electronic Systems) and to the CoFluent Studio (registered trademark) tools of the CoFluent Design company (applicant of this patent application), which implement a portion of this MCSE methodology.

The modelled router technique of the disclosure most especially claims to be suited to new telecommunications and multimedia technologies. The development of client needs, of voice and video data processing standards and of communications leads to the necessity of creating open-ended, multifunction and even dynamically configurable equipment.

In the remainder of the description, an example is presented of working the method according to the disclosure (underlying modelled routers technology), in a new version of the CoFluent Studio (registered trademark) tools, for obtaining a functional model and then an architectural model, as well as the routing technique. The various models are shown according to the notations and semantics described in MCSE.

Figure 9:
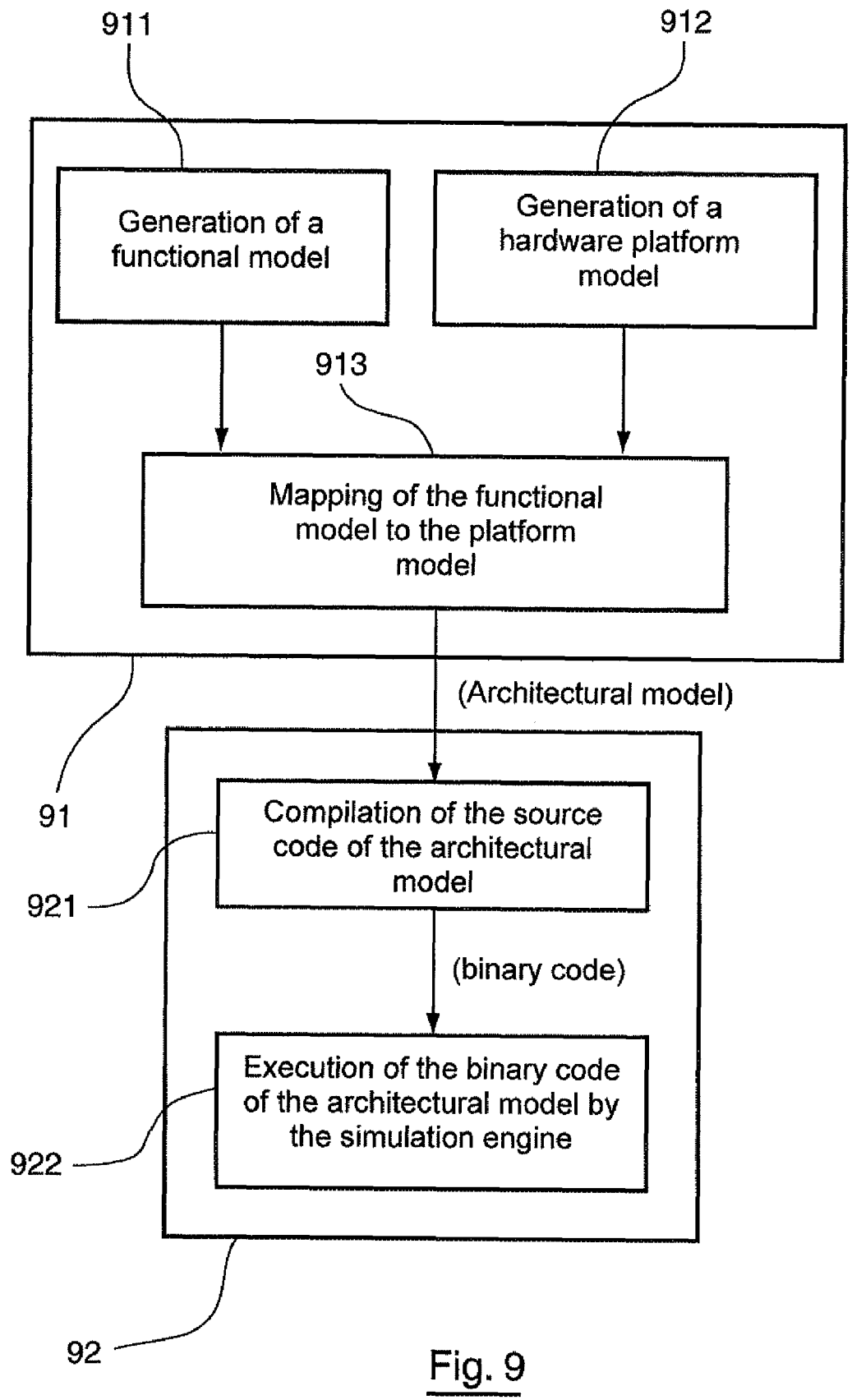
FIG. 9 shows a flowchart of a particular example of the simulation method according to the disclosure.

In the particular example below, and as shown in FIG. 9, the simulation method according to the disclosure includes:

a step 91 for constructing an architectural model, itself including:

a step 911 for generating a functional model of the complex system;

a step 912 for generating a hardware platform model of the complex system;

a step 913 for assigning the functional model to the platform model, in order to obtain the architectural model of the complex system;

a native simulation step 92 using this architectural model, itself including:

a step 921 for obtaining a binary code of the architectural model, via compilation of a source code for this architectural model;

a step 922 for direct execution of the binary code of the architectural model via a simulation engine.

3. Creation of the Functional Model

One of the CoFluent Studio (registered trademark) tools is a graphics editor which serves to capture the functional models (also called application models) including communicating and concurrent "modelled functions" having their own behaviour and inputs-outputs.

Figure 5:
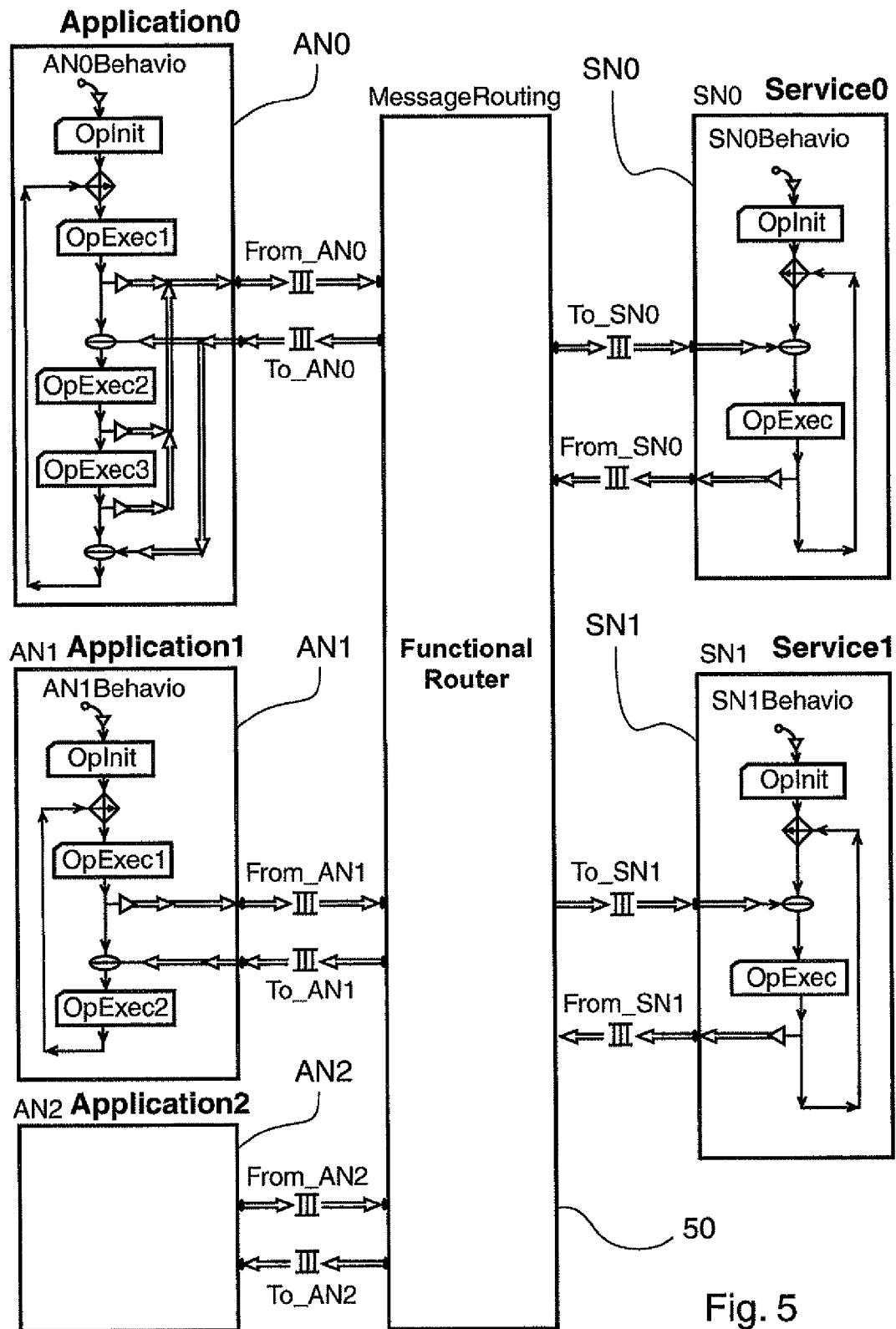
FIG. 5 shows an example of a functional model obtained with a particular example of the method according to the disclosure.

FIG. 5 shows the illustrative example with regard to the functional model. The latter is composed of simple modelled functions (AN0, AN1, AN2, SN0, SN1) (possible hierarchy) and of functional relationships ensured by a modelled functional router 50 (MessageRouting).

As concerns the example, the left-hand modelled functions (referenced AN0, AN1 and AN2) ensure so-called application-oriented functionalities coming into play for various use cases. The right-hand modelled functions (referenced SN0 and SN1) ensure services required by the application-oriented functions.

Each modelled function is connected to the modelled router via two communication channels. The routing technique is in no case restricted to this connections diagram. Each modelled function can potentially communicate with any other modelled function, by sending separate requests or transactions.

For routing, a data field for any request contains an identifier making it possible to know the access channel for the sending modelled function. This identifier is used by the modelled router 50. The identifier-sender match is ensured by a routing table associated with each modelled router. The match can be direct, via designation of the channel, or indirect, by providing the logic service name making it possible to deduce the channel in question.

The dynamic character of the solution is obtained by the fact that the routing table and the routing method (i.e., the use of the table for deducing the output channel) are programmable, even dynamically. As a matter of fact, a modelled function of the model can ensure changes in the routing table quite well during the development of the model. This particular feature makes it possible to support the dynamic reconfiguration of a system, as mentioned previously.

In order to have a functional router model (modelled router) best representing the reality of the functional interconnections, each modelled router is characterized by essential properties (called "attributes").

Figure 8:
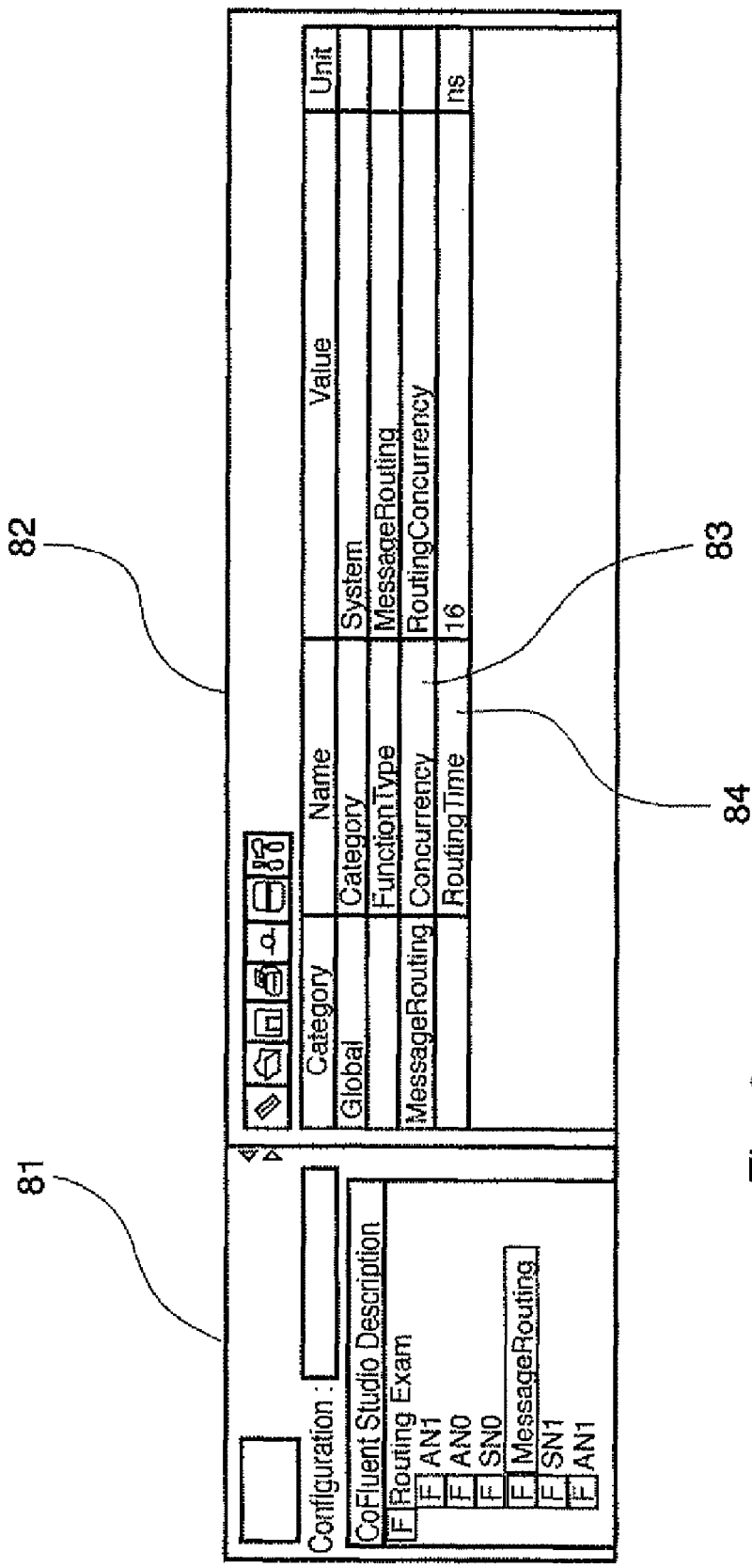
FIG. 8 shows a software tool for editing the attributes of a modelled router.

FIG. 8 shows an example of a software tool for editing the attributes of the modelled components (components) of a model, and in particular the attributes of a modelled router.

The left-hand window 81 displays the hierarchy of the functional model (the names of the elements are identical to those of FIG. 5) as well as the currently selected element of this hierarchy (it appears in a shaded frame: "MessageRouting" in this example) and the attributes of which can therefore be defined.

The right-hand window 82 displays the attributes of the element selected in the left-hand window 81. In the example shown, this is the modelled router called "MessageRouting" and referenced 50 in FIG. 5. The right-hand window 82 includes four columns, which indicate, respectively, for each attribute: the category of attributes to which this attribute belongs, the name of this attribute, the value of this attribute and the unit in which this value is expressed.

Among the various attributes of a modelled router, the following will be noted in particular:
  the "Concurrency" attribute 83: it makes it possible to define the number of possible simultaneous communications for the modelled router. Concurrency=1 involves sequential exchanges, Concurrency=large value models simultaneous exchanges, and thus the equivalent of an unlimited set of connections enabling simultaneous exchanges;
  the "RoutingTime" attribute 84: it makes it possible to parameterize the transfer time due to the interconnections.

4. Creation of the Architectural Model

The architectural model results from the assignment of a functional model to a platform model, as recommended by MCSE and supported by the CoFluent Studio (registered trademark) tools. A platform represents all of the execution resources and the interconnections between them.

The CoFluent studio (registered trademark) graphics editor also serves to capture the platform models including processors (CPU or DSP type software or ASIC or FPGA type hardware) and shared memories communicating via communication nodes.

Figure 6:
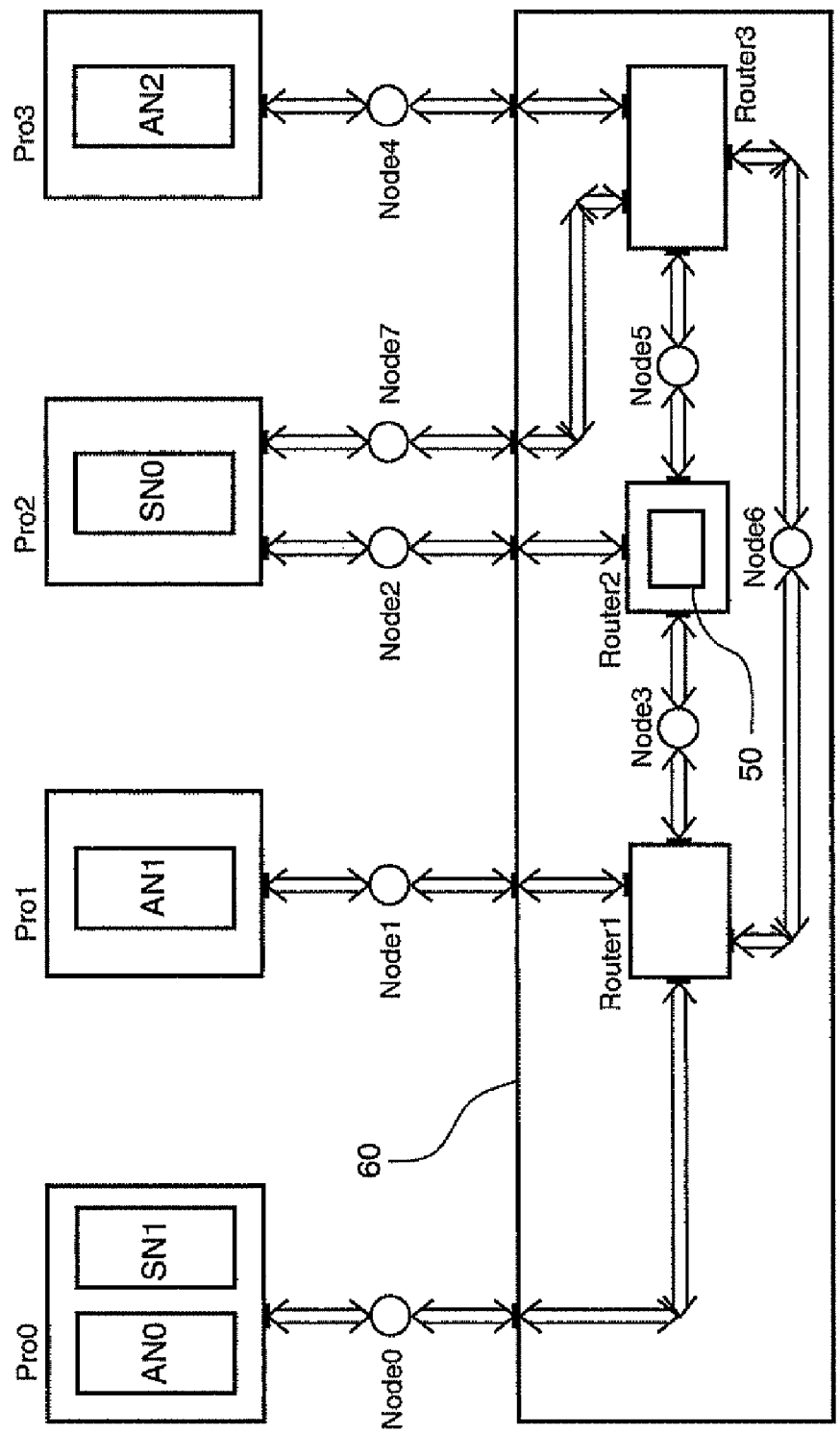
FIG. 6 shows an example assigning the functional model of FIG. 5 to a platform model, with assignment of a modelled functional router to a modelled physical router.

FIG. 6 shows the example of a platform model as it relates to the functional model of FIG. 5. This platform model includes four execution processors (referenced Pro0, Pro1, Pro2 and Pro3) and an interconnection network 60 constructed on the basis of three physical routers (referenced Router1, Router2 and Router3). The physical links between the processors and the routers, and between the routers, are shown by bidirectional communication nodes ("communication nodes") (referenced Node0 to Node7). These nodes represent an abstraction of the physical link type: bus, series or parallel point-to-point link, etc.

The operation of assigning (or of "mapping") the functional model to the platform model is carried out interactively with the CoFluent Studio (registered trademark) tool.

In a first step, the user simply places each modelled function on the modelled physical component they desire. In the example in question, and as shown in FIG. 6, the modelled functions are assigned to the modelled processors as follows:
  the modelled functions AN0 and SN1 are assigned to the modelled processor Pro0;
  the modelled function AN1 is assigned to the modelled processor Pro1;
  the modelled function SN0 is assigned to the modelled processor Pro2;
  the modelled function AN2 is assigned to the modelled processor Pro3.

Then, one of the CoFluent Studio (registered trademark) tools automatically produces the architectural model enabling the evaluation of its performance and the exploration of architectures. Since the objective is to automatically obtain the routing solution at the architectural level, from the functional routing, the technique of the disclosure implemented in this tool includes placing the modelled functional router 50 on one of the modelled physical routers of the interconnection network (the one referenced Router2 in this example). The objective of the solution, for the tool, is to automatically determine all of the functional interconnection paths so as to deduce the routing tables for each modelled physical router. As concerns the example, the method implemented is based on the declaration of the modelled routers Router1 and Router 3 as being access gateways between the modelled processors (Pro0 to Pro3) and the modelled router Router2.

Figure 7:
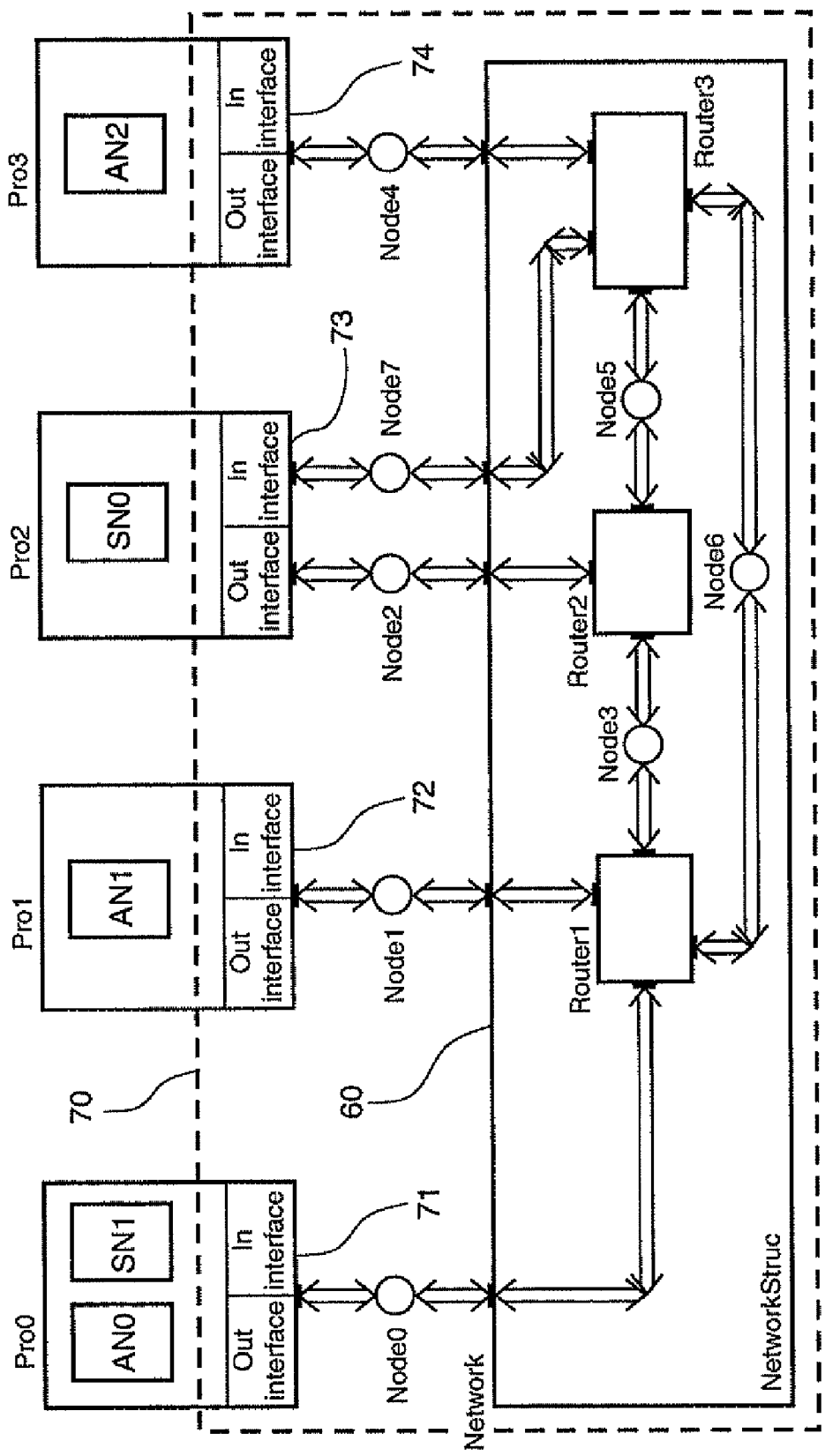
FIG. 7 shows the architectural model resulting from the assignment shown in FIG. 6.

FIG. 7 shows the architectural model resulting from the assignment shown in FIG. 6. In this resulting architectural model, the modelled router is in fact produced by a distributed routing structure (dotted-line frame referenced 70) which includes:
  the input and output interfaces (Out Interface, In Interface) (71 to 74) for each modelled processor (Pro0 to Pro3) for the communication of the modelled router with its external links. Each output interface uses the routing table and method of the modelled functional router;
  all of the modelled physical routers (Router1 to Router30 of the interconnection network 60. Each modelled router uses a routing table automatically generated by the tool.

Thus, the routing solution at the architectural level results from the single use of modelled components configured as modelled routers (characterised by a "MessageRouting" attribute). The overall functional routing which results from this technique is optimal. As a matter of fact, a functional communication which ends up being local to a modelled processor, e.g., between the modelled functions AN0 to SN1, is locally ensured by the modelled processor via the interfaces, without using the external access link. Furthermore, a modelled inter-processor functional communication is provided via the shortest path, e.g., the modelled physical router Router1 directly ensures the exchanges between the modelled processors Pro0 and Pro1.

In at least in one example of the disclosure, a technique is provided for constructing at least a functional model of a complex system. The technique makes it possible to reduce the time and the skills required for developing the model.

At least one example provides such a technique making it possible to produce a model which is not monolithic in its construction.

At least one example provides such a technique making it possible to create a more complex model via integration of simple models.

Although the present disclosure has been described with reference to one or more exemplary embodiments, workers skilled in the art will recognize that changes may be made in form and detail without departing from the disclosure and/or the appended claims.

What is claimed is:

1. A method for constructing an architectural model of a complex electronic system including a plurality of components integrated on a card or a chip, said method comprising:
    constructing, with a computing device, the functional model of the complex electronic system including a hierarchized set of modelled functional components,
    constructing, with the computing device, at least one modelled functional router representing an abstract model of a dummy router not having a physical counterpart in the complex electronic system, wherein each modelled functional router is associated to at least three of the modelled functional components and describes all possible interconnections between the respective at least three modelled functional components,
    wherein all the possible interconnections between the modelled functional components included in the functional model are described by the constructed at least one modelled functional router,
    constructing a platform model for the complex electronic system including a set of modelled physical components, wherein said platform model of the complex electronic system includes at least one modelled physical router representing an abstract model of a physical router, actually included in the complex electronic system, which describes a set of interconnections between at least two modelled physical components, and
    distributed mapping of said functional model to said platform model, via distributed assignment of said at least one modelled functional router to said at least one modelled physical router, to obtain an architectural model of said complex system.

2. The method of claim 1, wherein each modelled functional router possesses an input/output pair for each of said at least three modelled functional components for which said modelled functional router describes all the possible interconnections between the respective at least three modelled functional components.

3. The method of claim 2, wherein the number of input/output pairs that each modelled functional router possesses can be dynamically modified.

4. The method of claim 2, wherein each modelled functional router uses a routing table in order to route a request received at one of its inputs, coming from a first modelled functional component, to one of its outputs, bound for a second modelled functional component, the routing being based on the contents of said request.

5. The method of claim 4, wherein said routing table carried out routing belonging to the group including static routing and dynamic routing.

6. The method of claim 1, wherein said functional model of the system possesses a topology belonging to the group including:
    a topology with a single modelled functional router;
    a topology with at least two independent modelled functional routers;
    a topology with at least two hierarchized modelled functional routers.

7. The method of claim 1, wherein each modelled functional router is defined at least by a first attribute indicating the number of possible simultaneous communications for that modelled functional router.

8. The method of claim 1, wherein each modelled functional router is defined at least by a second attribute indicating a transfer time due to that modelled functional router.

9. The method of claim 1 and further comprising:
    recording the functional model on a computer-readable medium.

10. A non-transitory storage device, which is computer-readable and stores a set of instructions executable by a computer in order to implement a method comprising:
    constructing a functional model of a complex electronic system including a hierarchized set of modelled functional components, said complex electronic system including a plurality of components integrated on a card or chip,
    constructing at least one modelled functional router representing an abstract model of a dummy router not having a physical counterpart in the complex electronic system, wherein each modelled functional router is associated to at least three of the modelled functional components and describes all possible interconnections between the respective at least three modelled functional components,
    wherein all the possible interconnections between the modelled functional components included in the functional model are described by the constructed at least one modelled functional router,
    constructing a platform model for the complex electronic system including a set of modelled physical components, wherein said platform model of the complex electronic system includes at least one modelled physical router representing an abstract model of a physical router, actually included in the complex electronic system, which describes a set of interconnections between at least two modelled physical components, and
    distributed mapping of said functional model to said platform model, via distributed assignment of said at least one modelled functional router to said at least one modelled physical router, to obtain an architectural model of said complex system.

* * * * *